United States Patent
Fasano et al.

(10) Patent No.: US 7,087,513 B2
(45) Date of Patent: Aug. 8, 2006

(54) METHOD TO PRODUCE LOW STRENGTH TEMPORARY SOLDER JOINTS

(75) Inventors: Benjamin V. Fasano, New Windsor, NY (US); Richard F. Indyk, Wappingers Falls, NY (US); Kevin M. Prettyman, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/904,138

(22) Filed: Oct. 26, 2004

(65) Prior Publication Data

US 2006/0088997 A1   Apr. 27, 2006

(51) Int. Cl.
*H01L 21/44* (2006.01)
*H01L 21/50* (2006.01)

(52) U.S. Cl. ............ 438/612; 438/613; 438/615; 438/669; 438/670; 438/671; 438/109; 257/E21.509

(58) Field of Classification Search .......... 438/612, 438/613, 615, 669–677, 109
See application file for complete search history.

(56) References Cited

U.S. PATENT DOCUMENTS

| 5,237,269 A * | 8/1993 | Aimi et al. ............. 324/158.1 |
| 5,574,386 A | 11/1996 | Beaumont et al. |
| 5,931,685 A * | 8/1999 | Hembree et al. ............ 439/74 |
| 2005/0062142 A1* | 3/2005 | Yeh et al. .................. 257/678 |

* cited by examiner

*Primary Examiner*—Richard Elms
*Assistant Examiner*—Mohsen Ahmadi
(74) *Attorney, Agent, or Firm*—James J. Cioffi

(57) ABSTRACT

The present invention provides a method for producing a temporary chip carrier for semiconductor chip burn-in test and speed sorting. A multi-layered substrate or card, usually comprised of one of various materials is made by offsetting the conductor-filled vias or holes in the outer few layers with the outer most layer not being filled with a conductor, such that a partially filled via or hole is produced. This effectively produces a smaller surface conductor feature, on which the semiconductor chip is temporarily attached, electrically tested, and subsequently removed using various methods, at forces much lower than normal chip removal processes require.

9 Claims, 1 Drawing Sheet

METHOD TO PRODUCE LOW STRENGTH TEMPORARY SOLDER JOINTS

BACKGROUND OF THE INVENTION

The present invention relates to a structure and method for use in tests of circuit chips, and more particularly relates to a method and structure for making temporary connections between circuit chips and a temporary chip carrier for use in conducting burn-in tests of the circuit chips.

As semiconductor devices become smaller and their density increases there is a corresponding increase in overall chip failure rates. Semiconductor manufacturers are challenged to ensure that chips are tested and known to be good, "known good die" (KGD), before being used in the next level of assembly, which typically is attachment to a substrate or board. There is therefore a need to identify and eliminate defective chips before they are attached to a product. Burn-in processes have been developed to identify and eliminate the use of defective chips. This burn-in test electrically operates the chip at elevated voltage and temperature levels for an extended period of time to simulate the actual operation of the chip for its normal and expected lifetime in a final product by monitoring the electrical responses of the chip and thereby screen out defective chips. The testing may also involve a "speed sort", separating and categorizing chips that operate at various levels of performance to be used in various products.

A Temporary Chip Attach (TCA) carrier, typically a substrate or board, is provided for testing the chips. The TCA carrier has electrical contacts which correspond to the electrical contacts on the semiconductor chip. The chip is typically positioned on the chip carrier so that the solder connections on the chip are aligned with the corresponding electrical contacts on the chip carrier. The solder connections are then reflowed to make electrical connections between the chip and chip carrier. After burn-in the chip is removed from the TCA carrier. This is typically accomplished by a shear or tensile process, either at room or elevated temperatures.

The known good chip is then reconditioned for use in functional product. The reconditioning is typically a thermal process to restore the geometry of the solder connection on the chip. Since good chips will be subsequently attached to product it is necessary to remove the chip from the TCA carrier after burn-in with a minimum amount of force to avoid damage to the chip. The same TCA carrier may then be used for testing additional chips. It is therefore desirable to temporarily attach the semiconductor chip to the chip carrier in such a way that both can be easily separated after burn-in without mechanical damage to either the semiconductor chip or the TCA carrier.

Various methods are known for building such TCA carriers, most of which involve some form of thin film technology. The prior art process of producing temporary chip carriers typically involve the use of photolithographic techniques and/or masks in order to reduce the area actually in contact between the TCA carrier and the solder connections on the semiconductor device. The thin film structures are usually metallic or polymeric. The intent of the thin film structure is to reduce the force necessary for chip removal by reducing the overall joining area between the chip carrier and chip electrical connection.

There is therefore a need to avoid using thin film processing, typically an expensive and a time consuming operation. Thus, a purpose of the present invention is to have a method for providing a temporary chip attach carrier which does not require thin films.

These and other purposes of the present invention will become more apparent after referring to the following description considered in conjunction with the accompanying drawings.

BRIEF SUMMARY OF THE INVENTION

The present invention discloses a method to provide a controlled wettable area for a temporary chip attach carrier comprising the steps of providing a first layer with an array of filled conductive vias; providing a second layer with an array of unfilled vias, the array of unfilled vias having a controlled offset with respect to the array of filled vias; placing the second layer on top of the first layer to produce an array of partially exposed conductive vias, the array of partially exposed conductive vias having a reduced wettable conductive area; placing the first and second layers in a laminate; curing the laminate to form a temporary chip carrier having a controlled wettable area for temporary chip attach.

The temporary chip attach carrier may be a ceramic, glass ceramic or organic substrate. In another embodiment the array of partially exposed conductive vias have varying reduced exposed wettable conductive areas corresponding to different current or voltage requirements.

The present invention also discloses another method to provide a controlled wettable area for a temporary chip attach carrier comprising the steps of providing a first layer with an array of filled conductive vias; providing a second layer with an array of unfilled vias, the array of unfilled vias being aligned with the array of filled conductive vias but having a smaller area; placing the second layer on top of the first layer to produce an array of partially exposed conductive vias, the array of partially exposed conductive vias having a reduced conductive area; placing the first and second layers in a laminate; curing the laminate to form a temporary chip attach carrier having a controlled wettable area for temporary chip attach.

The present invention also discloses a temporary chip attach carrier to which a semiconductor chip is attached in order to carry out burn-in tests on the chip, the temporary chip attach carrier comprising a plurality of contact pads on a surface to which a corresponding plurality of solder connections on the chip are connected, the contact pads having a reduced exposed solder wettable area. The temporary chip attach carrier contact pads may have varying reduced exposed solder wettable areas corresponding to different current or voltage requirements.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed descriptions which follows taken in conjunction with the accompanying drawings in which:

DETAILED DESCRIPTION OF THE INVENTION

The present invention discloses a new method for producing a temporary chip carrier for burn-in test and speed sorting of semiconductor chips. The temporary chip carrier, typically a multi-layered substrate or card, has a top layer or top surface containing hundreds or thousands of contact pads. These contact pads are typically punched holes or visa, which are then filled with a conductive paste. In the present invention an additional layer or cover sheet is placed over the top layer. The cover sheet also has punched via holes but they have not been filled with conductive paste. In one embodiment the holes in the cover sheet are offset from the contact pads in the top layer. This offset creates a partially exposed contact pad area and produces a smaller surface conductor feature on which the semiconductor chip is subsequently and temporarily attached. The orientation and degree of the offset of the hole pattern in the cover sheet to the contact pad pattern is used to control the percentage and orientation of the subsequent exposed wettable area for temporary chip attach. The reduced wettable area allows removal of the chip after burn-in test at forces much lower than a full contact area process would require.

Alternatively the holes in the cover sheet may be aligned with the contact pad pattern but the holes in the cover sheet are made smaller than the contact pads. Either method provides flexibility in controlling the forces required for separation of the chip from the temporary chip carrier after burn-in test by reducing the contact wettable area while providing an electrical connection to the chip.

Figure 1A:
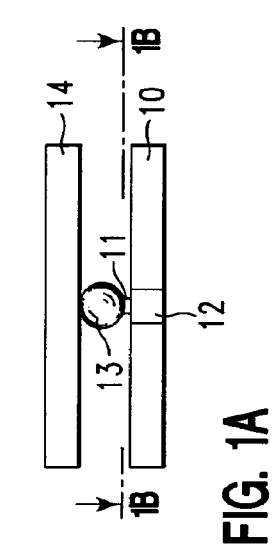
FIG. 1 illustrates a thin film method for producing a TCA vehicle.
Figure 1B:
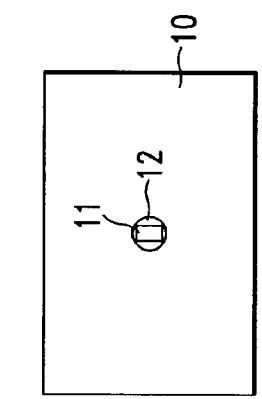

FIG. 1a shows a cross-section view of a conventional temporary chip attach carrier. The chip carrier 10 is electrically attached to the semiconductor chip 14 to be burn-in tested by a solder interconnect 13, typically formed in an array. The conductive via 12 is only attached to the solder interconnect 13 by a smaller plated area 11, formed by photolithographic and thin film processes. This is shown more clearly in FIG. 1b where a top-down view shows a typical circular via 12 and the reduced contact area 11. In a typical ceramic substrate chip carrier the conductive via will be molybdenum and the plated area will be plated with nickel and often gold. This process is typically expensive and labor intensive. The present invention provides a simpler and less expensive method to produce the reduced contact area between temporary chip carrier and semiconductor chip.

Figure 2A:
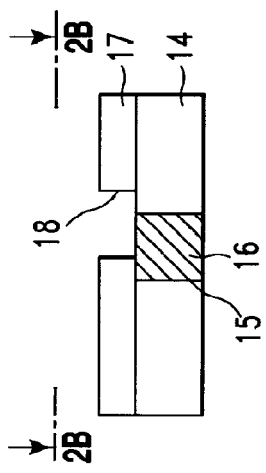
FIG. 2 illustrates a first embodiment of the invention.
Figure 2B:
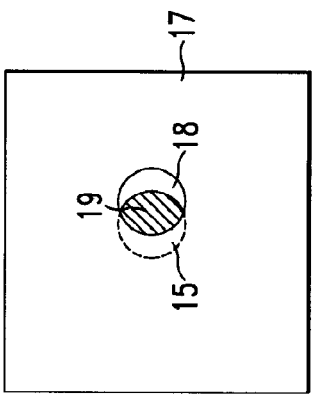

FIG. 2a illustrates a first embodiment of the present invention. A first greensheet, or laminate layer, 14, having first via holes or openings 15, is filled with a conductive paste, 16. This first sheet would be the top layer of a multi-stack layer of sheets and would be the surface layer to which the semiconductor chip would be attached in the conventional method. According to the present invention an additional sheet 17 is placed on sheet 14 so that sheet 17 will now become the top layer or surface layer to which the chip will be attached. This additional sheet 17 has no conductive paste within the via holes or openings 18. In addition the via holes or openings 18 are slightly misaligned or intentionally misregistered with reference to the first filled holes 15 of the first sheet 14. This is shown more clearly in the top down view of FIG. 2b where a top view illustrates the reduced wettable area 19 created by the partial overlap of additional sheet opening 18 over first sheet conductive via 15. For simplicity only one conductive via is illustrated in the preceding Figures. It will be appreciated by one of skill in the art that actual layers would contain hundreds or thousands of such features.

In the example of a multi-layered ceramic chip carrier the sheets or layers, now including the top cover sheet of the present invention, would be stacked with adjacent layer registration. The resulting stack of layers will be laminated, typically with both heat and pressure, to form an unfired monolithic laminate. This laminate can then be "sintered" or fired, possibly with the application of a constraining pressure, to form a hardened ceramic substrate. During the lamination step some extrusion of the metallization paste 16 in layer 14 would partially or fully extrude into the openings 18 in sheet 17. In the conventional sintering process the conductive paste 16 from sheet 14 will also partially flow up into the holes 18 in cover sheet 17. This will result in a surface array of contact pads with both a reduced wettable area and in some instances a slight depression between the ceramic surface and via metallurgy. This will further facilitate post burn-in separation between the chip and chip carrier. Typically a plating operation is used to provide a nickel and gold surface finish to the contact pads to enhance solder wetting and prevent the formation of intermetallic compounds that can form between the solder and the contact pad. This plating can be of sufficient thickness to produce a surface via that is flush with the surface of the substrate.

Figure 3A:
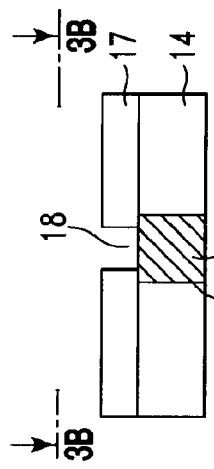
FIG. 3 illustrates another embodiment of the invention.
Figure 3B:
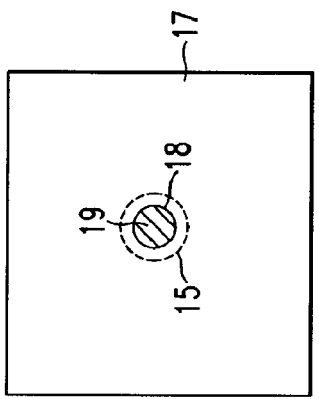

Referring now to FIG. 3a there is shown an alternate embodiment of the present invention. As in the prior embodiment a first greensheet, or laminate layer, 14, having first via holes or openings, 15, is filled with a conductive paste, 16. According to this embodiment the additional sheet 17 again has no conductive paste within the via holes or openings 18, but now the via holes or openings 18 are aligned with reference to the first filled holes 15 of the first sheet 14. However the via holes 18 are now smaller than the underlying vias 15. This is shown more clearly in the top down view of FIG. 3b where a top view illustrates the reduced wettable area 19 created by the overlap of additional sheet opening 18 over first sheet conductive via 15. As an example, a typical ceramic sheet may have conductive vias 15 of approximately 0.004 inches in diameter. The openings 18 in the cover sheet may have a diameter of approximately 0.002 inches.

As discussed above, once the individual layers are joined using either a conductive adhesive or thermoplastic lamination process, the conductive paste from the first via hole in the first sheet will partially fill the second hole of the cover sheet, thus producing a hole or holes that are partially filled with conductor in the cover sheet. The attachment of the sheets can be done in a number of ways well known in the art including but not limited to lamination, using pressure and/or heat (sintering), or an adhesive material. The second, partially filled sheet, serves as the outermost sheet in a multi-layered package. Misalignment can vary in degree to produce different size and different orientation conductors in the outermost sheet. These partially exposed conductors serve as electrical contacts in a TCA vehicle.

While the above example is directed to a ceramic chip carrier, the method is not limited to a ceramic chip carrier. The method is also applicable to organic chip carriers such as circuit boards. A similar process is used in the stackup construction of printed circuit boards, for example when partially cured dielectric layers are collated and laminated to form multilayer circuitry. The organic laminate may be cured at a temperature and pressure sufficient to provide a structurally stable electrical interconnection.

Although the preceding Figures show circular features which are typically punched, alternatively other shapes may also be used to tailor the opening and underlying vias. These alternative shapes may also be punched or may be created by well known non-mechanical means such as laser ablation or chemical etching processes.

In another aspect of the present invention a radial offset or global feature expansion or contraction of the via pattern on the overlying layer can be configured to expose the desired amount and orientation of the contact wettable metallurgy. The size of the wettable area can also vary on the same layer. The amount of wettable area may be tailored to accommodate the different current or voltage requirements among the chip contact pads. For example small overlaps for contact pads where little power is needed for actual burn-in such as signal pads, while the voltage and ground contact pads can be made to have greater overlaps to provide more current carrying capacity for these conductive paths.

This wettable area tailoring or personalization can be used to minimize the shear or tensile forces needed to remove chips or other devices or packages after testing. For low strength dielectric layers typical in semiconductor devices, reducing the overall shear force during chip removal is desirable to prevent damage to the circuitry that may result if a large load is needed to separate the solder from the temporary chip carrier.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method to provide a controlled wettable area for a temporary chip carrier comprising the steps of:
    providing a first layer with an array of filled conductive vias;
    providing a second layer with an array of unfilled vias, said array of unfilled vias having a controlled offset with respect to said array of filled vias;
    placing said second layer on top of said first layer to produce an array of partially exposed conductive vias, said array of partially exposed conductive vias having a reduced wettable conductive area;
    placing said first and second layers in a laminate;
    curing said laminate to form a temporary chip carrier having a controlled wettable area for temporary chip attach.

2. The method of claim 1 wherein said temporary chip carrier is an organic substrate.

3. The method of claim 1 wherein said temporary chip carrier is a glass ceramic substrate and said curing step is a sintering process.

4. The method of claim 1 wherein said temporary chip carrier is a ceramic substrate and said curing step is a sintering process.

5. The method of claim 1 wherein said array of partially exposed conductive vias have varying reduced exposed wettable conductive areas corresponding to different current or voltage requirements.

6. A method to provide a controlled wettable area for a temporary chip carrier comprising the steps of:
    providing a first layer with an array of filled conductive vias;
    providing a second layer with an array of unfilled vias, said array of unfilled vias being aligned with said array of filled conductive vias but having a smaller area;
    placing said second layer on top of said first layer to produce an array of partially exposed conductive vias, said array of partially exposed conductive vias having a reduced conductive area, and having varying reduced exposed wettable conductive areas corresponding to different current or voltage requirements;
placing said first and second layers in a laminate;
curing said laminate to form a temporary chip carrier having controlled wettable area for temporary chip attach.

7. The method of claim 6 wherein said temporary chip carrier is an organic substrate.

8. The method of claim 6 wherein said temporary chip carrier is a glass ceramic substrate and said curing step is a sintering process.

9. The method of claim 6 wherein said temporary chip carrier is a ceramic substrate and said curing step is a sintering process.

* * * * *